(12) United States Patent
Coimbra et al.

(10) Patent No.: US 9,194,890 B2
(45) Date of Patent: Nov. 24, 2015

(54) METAL-OXIDE-SEMICONDUCTOR (MOS) VOLTAGE DIVIDER WITH DYNAMIC IMPEDANCE CONTROL

(71) Applicant: Freescale Semiconductor, Inc., Austin, TX (US)

(72) Inventors: Ricardo P. Coimbra, Campinas (BR); Edevaldo Pereira Silva, Jr., Campinas (BR)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 13/890,394

(22) Filed: May 9, 2013

(65) Prior Publication Data
US 2014/0333367 A1  Nov. 13, 2014

(51) Int. Cl.
*H03K 17/687* (2006.01)
*G05F 1/10* (2006.01)
*G05F 3/02* (2006.01)
*G01R 15/04* (2006.01)

(52) U.S. Cl.
CPC ...................................... *G01R 15/04* (2013.01)

(58) Field of Classification Search
CPC  H03K 17/687; H03K 17/6872; H03K 17/693
See application file for complete search history.

(56) References Cited

U.S. PATENT DOCUMENTS

| 2,784,369 | A |   | 3/1957 | Fenemore et al. |
| 3,403,324 | A |   | 9/1968 | Bradley |
| 3,519,931 | A |   | 7/1970 | Bradley |
| 4,578,772 | A |   | 3/1986 | Fujii |
| 4,847,518 | A | * | 7/1989 | Leidich ......................... 327/541 |
| 5,233,289 | A |   | 8/1993 | Beasom |
| 5,493,207 | A |   | 2/1996 | Beasom |
| 6,407,623 | B1 | * | 6/2002 | Bazarjani et al. ............. 327/541 |
| 7,061,308 | B2 |   | 6/2006 | Abadeer et al. |
| 7,307,467 | B2 |   | 12/2007 | Goodnow et al. |
| 7,579,897 | B2 |   | 8/2009 | Goodnow et al. |
| 2005/0073354 | A1 |   | 4/2005 | Abadeer et al. |
| 2014/0084975 | A1 | * | 3/2014 | Tang et al. .................... 327/156 |

* cited by examiner

*Primary Examiner* — Hai L Nguyen
(74) *Attorney, Agent, or Firm* — Luiz von Paumgartten; Fogarty, L.L.C.

(57) ABSTRACT

Metal-Oxide-Semiconductor (MOS) voltage divider with dynamic impedance control. In some embodiments, a voltage divider may include two or more voltage division cells, each voltage division cell having a plurality of Metal-Oxide-Semiconductor (MOS) transistors, a least one of the plurality of MOS transistors connected to a signal path and at least another one of the plurality of MOS transistors connected to a control path, the voltage division cell configured to provide a voltage drop across the signal path based upon a control signal applied to the control path.

11 Claims, 6 Drawing Sheets

US 9,194,890 B2

METAL-OXIDE-SEMICONDUCTOR (MOS) VOLTAGE DIVIDER WITH DYNAMIC IMPEDANCE CONTROL

FIELD

This disclosure relates generally to electronic devices, and more specifically, to a Metal-Oxide-Semiconductor (MOS) voltage divider with dynamic impedance control.

BACKGROUND

Voltage dividers are often used in electronics, for example, to provide a voltage that is different from that of an available power source. Some voltage dividers have been designed using resistors. On a semiconductor substrate, commonly utilized voltage dividers use P+ poly resistors created with polysilicon.

However, the use of resistor-based voltage dividers in an integrated circuit (IC) has some drawbacks. For instance, it is difficult to form a resistor with high resistance using polysilicon, which requires a large surface area. Also, the resistance presented by a polysilicon resistor tends to vary with process and temperature changes, thus rendering it unsuitable for certain applications.

Although there have been attempts to create voltage dividers using Metal-Oxide-Semiconductor (MOS) transistors, those voltage dividers operate based on gate tunneling currents. As the inventors hereof have noted, gate tunneling currents are not well modeled and are highly dependent on technology, voltage, and temperature, which disfavor robustness and portability. Other approaches require the employment of special devices such as depletion-mode FET transistors or double-gate FET transistors, which are not commonly available Complementary MOS (CMOS) technologies. To address these, and other concerns, the inventors hereof have developed MOS-based voltage dividers capable of using standard MOS transistors operating in triode or saturation modes.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Disclosed herein are Metal-Oxide-Semiconductor (MOS) voltage dividers with dynamic impedance control. In some embodiments, a MOS voltage divider may replace a conventional resistor voltage divider, particularly in low-power applications, resulting in a significantly improved area/power consumption ratio. Moreover, the systems and methods described herein enable dynamic control of a voltage divider's impedance through control inputs separate from the signal path, which allow the MOS voltage divider to be employed as a building block in various other analog circuits.

In some implementations, a voltage divider cell may include an arrangement of appropriately biased p-type MOS (PMOS) and n-type MOS (NMOS) transistors, as explained in more detail below. A divider cell includes a signal branch and a control signal branch. The impedance presented to a current flowing through the signal branch may be dynamically controlled, during its operation, by applying and/or varying another current flowing through the control branch.

Voltage divider cells may be stacked to form a voltage divider. The impedance of each unitary cell may be controlled by the current signal applied to its respective control signal branch. Generally speaking, the signal branches of each individual voltage divider cell may be coupled in series with one another, with one or more voltage division taps placed along the signal path. Control branches may be left independent or also coupled in series. When coupled in series, the various control branches share the same control signal, whereas individual control branches enable independent impedance control for different cells within a voltage divider.

Figure 1:
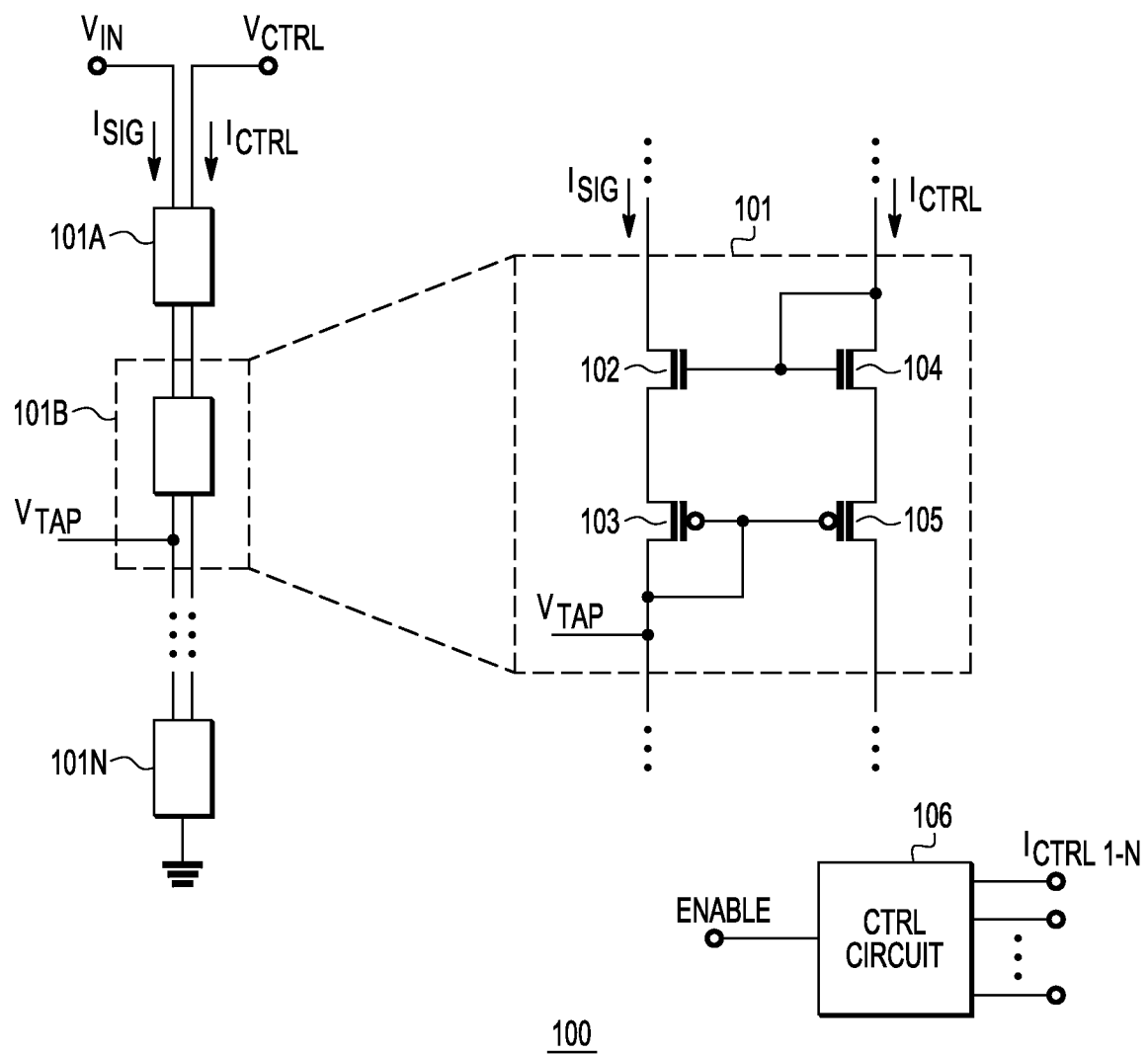
FIG. 1 is a circuit diagram of an example of a voltage divider cell according to some embodiments.

FIG. 1 is a circuit diagram of an example of a voltage divider cell 101. In this embodiment, an input voltage $V_{IN}$ to be divided is provided to N voltage division cells 101A-N, and creates a signal path through which a main signal $I_{SIG}$ flows. A control voltage $V_{CTRL}$ is also provided to create a control path through which a control signal $I_{CTRL}$ flows. Each of voltage division cells 101A-N presents an impedance, and therefore one or more nodes on the signal path between cells voltage division cells 101A-N may be tapped, for example, at $V_{TAP}$, to effect voltage division operation(s).

A circuit diagram for a given one of voltage division cells 101A-N, referred to as cell 101, is also illustrated. As shown, main signal $I_{SIG}$ is an electrical current injected into a signal path or branch of cell 101, and control signal $I_{CTRL}$ is a different electrical current injected into a control path or branch of cell 101.

On the signal side of cell 101, first NMOS transistor 102 is coupled in series with first P-type (PMOS) transistor 103 such that a source terminal of first NMOS transistor 102 is coupled to a source terminal of first PMOS transistor 103. Also, a gate terminal of first PMOS transistor 103 is coupled to a drain terminal of first PMOS transistor 103.

On the control side of cell 101, second NMOS transistor 104 is coupled in series with second PMOS transistor 105 such that a source terminal of second NMOS transistor 104 is coupled to a source terminal of second PMOS transistor 105. A gate terminal of second NMOS transistor 104 is coupled to a gate terminal of first NMOS transistor 102, a drain terminal of second NMOS transistor 104 is coupled to the gate terminal of second NMOS transistor 104, and a gate terminal of second PMOS transistor 105 is coupled to the gate terminal of the first PMOS transistor 103.

In some embodiments, NMOS transistors 102 and 104 are configured to operate in strong inversion; that is, in each of transistors 102 and 104, the electron density in the channel is larger than the hole density in the bulk. Also, first NMOS transistor 102 is configured to operate in a linear region or triode mode such that its drain current has a strong dependence on its drain-to-source voltage ($V_{ds}$). Meanwhile, first PMOS transistor 103, second NMOS transistor 104, and second PMOS transistor 105 are each configured to operate in a saturation region such that, for each of these transistors, its drain current has negligible dependence on $V_{ds}$. In other embodiments, however, NMOS transistors 102 and 104 may be configured to operate without strong inversion—that is, the gate-to-source voltage ($V_{gs}$) for either transistor 102 or 104 may be lower than its threshold voltage ($V_{th}$)—so long as NMOS transistor 104 and PMOS transistors 103 and 105 operate in saturation mode (where drain current has negligible dependence on $V_{DS}$ voltage) while NMOS transistor 102 operates in linear or triode region (where drain current has strong dependence on $V_{DS}$).

As such, in the signal branch, first NMOS transistor 102 is configured to operate as a variable resistor, and first PMOS transistor 103 is configured to operate as a diode. The impedance presented by first NMOS transistor 102 is controllable by control signal $I_{CTRL}$.

In this case, the voltage drop ($V_{DIV}$) between the drain of first NMOS transistor 102 and the drain of first PMOS transistor 103 is given by:

$$V_{DIV} = V_{SG\_103} + R_M I_{SIG}$$

where $R_M$ is the effective resistance presented to $I_{SIG}$ by cell 101 and $V_{SG\_103}$ is the source-to-gate-voltage of first PMOS transistor 103. Using standard MOS Field-Effect Transistor (MOSFET) device models for each of transistors 102-105 configured as described above, the value of $R_M$ may be calculated as follows:

$$R_M = \frac{1}{\sqrt{I_{CTRL} \cdot \mu_n C_{OX} S_n (W_n/L_n)} + \mu_n C_{OX} S_n (W_n/L_n) \cdot (V_{SG\_105} - V_{SG\_103})}$$

where $W_n/L_n = W_{102}/L_{102} = S_n (W_{104}/L_{104})$, $W_{102}$ being the gate width of first NMOS transistor 102, $L_{102}$ being the gate length of first NMOS transistor 102, $W_{104}$ being the gate width of second NMOS transistor 104, and $L_{104}$ being the gate length of second NMOS transistor 104; and where $C_{ox}$ is the oxide capacitance of transistors 102-105, $\mu_n$ is the electron mobility of first NMOS transistor 102, $V_{SG\_105}$ is the source-to-gate voltage of second PMOS transistor 105, and $V_{SG\_103}$ is the source-to-gate voltage of first PMOS transistor 103.

The values of $V_{SG\_105}$ and $V_{SG\_103}$ may be calculated depending upon whether the first and second PMOS transistors 103 and 105 are operating in strong or weak inversion. For example, when operating in strong inversion, the following expression may be used:

$$V_{SG\_105} - V_{SG\_103} = \sqrt{\frac{2}{\mu_p C_{OX}(W_p/L_p)}} \left( \sqrt{S_p I_{CTRL}} - \sqrt{I_{SIG}} \right)$$

where $W_p/L_p = W_{103}/L_{103} = S_p(W_{105}/L_{105})$, $W_{103}$ being the gate width of first PMOS transistor 103, $L_{103}$ being the gate length of first PMOS transistor 103, $W_{105}$ being the gate width of second PMOS transistor 105, and $L_{105}$ being the gate length of second PMOS transistor 105; and where $\mu_p$ is the hole mobility of first PMOS transistor 103.

Conversely, when first and second PMOS transistors 103 and 105 are operating in weak inversion, the following expression may be used:

$$V_{SG\_105} - V_{SG\_103} = \frac{nkT}{q} \exp\left( \frac{I_{CTRL}}{I_{SIG}} \cdot S_p \right)$$

where n is a slope factor and (kT/q) is the thermal voltage of first and second PMOS transistors 103 and 105.

It should be noted that, although the foregoing expressions are based on well-known MOSFET models, in other embodiments other device models, and therefore other expressions, may be used. Regardless of the device model being used, however, by maintaining first NMOS transistor 102 in a linear region or triode mode and other transistors 103-105 in a saturation region, first NMOS transistor 102 operates as a variable resistor, first PMOS transistor 103 operates as a diode, and the impedance in the signal path $I_{SIG}$ is controllable by control signal $I_{CTRL}$. In some implementations, control current $I_{CTRL}$ may be used to dynamically control the impedance of first NMOS transistor 102 during operation of cell 101.

In that regard, one or more control signals $I_{CTRL1-N}$ (used in subsequent embodiments described below) may be generated by logic circuit 106 in the present of an enabling signal ("enable"). In some cases, each of control signals $I_{CTRL1-N}$ may have constant values that are different from each other. Additionally or alternatively, in some applications, any given one of control signals $I_{CTRL1-N}$ may vary as a function of another suitable variable, such as time, temperature, etc.

Figure 2:
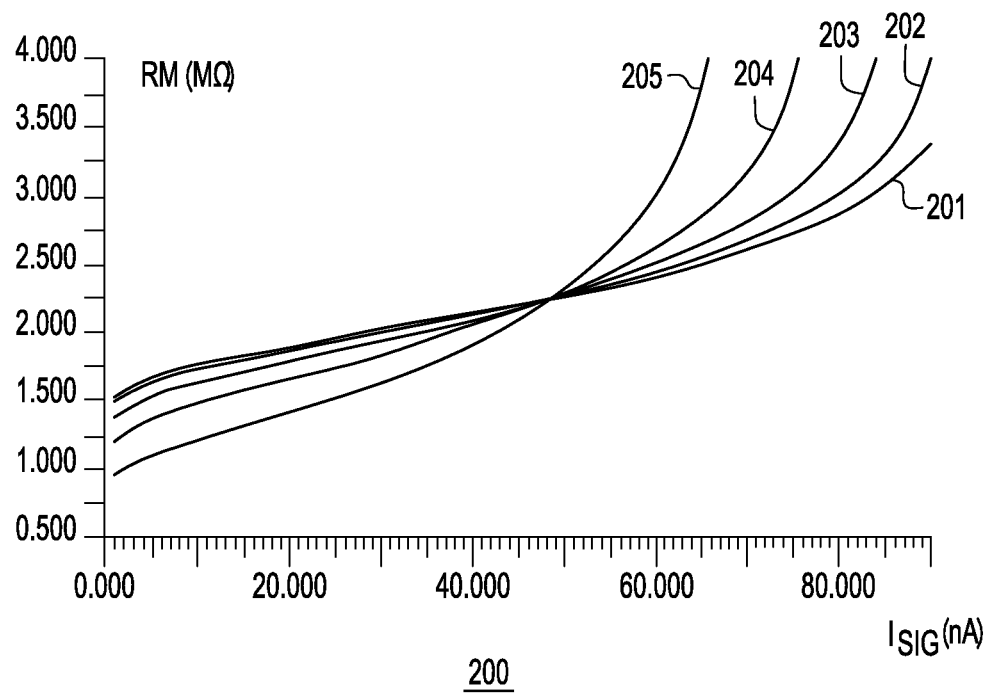
FIG. 2 is a graph illustrating the operation of a voltage divider cell according to some embodiments.

Turning now to FIG. 2, graph 200 illustrates operation of voltage divider cell 101 according to some embodiments. Particularly, graph 200 shows values of $R_M$ (in MΩ) as a function of $I_{SIG}$ (in nA) for different transistor sizes. Specifically, first and second NMOS transistors 102 and 104, as well as first and second PMOS transistors 103 and 105 each have a fixed with channel width of 0.8 μm. First and second NMOS transistors 102 and 104 also have a fixed channel length of 180 μm, whereas the channel length of first and second PMOS transistors 103 and 105 was allowed to vary. $I_{SIG}$ was set as a sweep variable while $I_{CTRL}$ was set to a fixed value of approximately 50 nA.

Curve 201 shows $R_M$ as a function of $I_{SIG}$ when the channel width of first and second PMOS transistors 103 and 105 is 0.8 μm; curve 202 shows $R_M$ as a function of $I_{SIG}$ when the channel width of first and second PMOS transistors 103 and 105 is 3.1 μm; shows $R_M$ as a function of $I_{SIG}$ when the channel width of first and second PMOS transistors 103 and 105 is 12.2 μm; shows $R_M$ as a function of $I_{SIG}$ when the channel width of first and second PMOS transistors 103 and 105 is 47 μm; and shows $R_M$ as a function of $I_{SIG}$ when the channel width of first and second PMOS transistors 103 and 105 is 185 μm.

It may be noted from graph 200 that $R_M$ tends to increase as $I_{SIG}$ increases, which favors low power operation and consumption.

Figure 3:
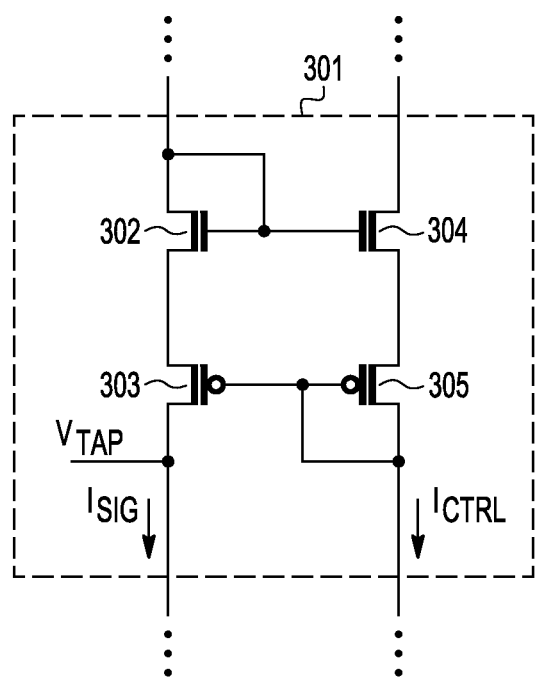
FIG. 3 is a circuit diagram of an example of another voltage divider cell according to some embodiments.

FIG. 3 is a circuit diagram of an example of another voltage divider cell 300. In some embodiments, voltage divider cell 301 may be used as one of cells 101A-N in FIG. 1. Similarly as before, here main signal $I_{SIG}$ is an electrical current injected into a signal path or branch of cell 301, and control signal $I_{CTRL}$ is a different electrical current injected into a control path or branch of cell 301. One or more nodes on the signal path may be tapped, for example, at $V_{TAP}$, to effect voltage division operation(s).

On the signal side of cell 301, first NMOS transistor 302 is coupled to first (PMOS) transistor 303 such that a source terminal of first NMOS transistor 302 is coupled to a source terminal of first PMOS transistor 303. Also, a drain terminal of first NMOS transistor 302 is coupled to a gate terminal of first NMOS transistor 302.

On the control side of cell 302, second NMOS transistor 304 is coupled in series with second PMOS transistor 305 such that a source terminal of second NMOS transistor 304 is coupled to a source terminal of second PMOS transistor 305. The gate terminal of first NMOS transistor 302 is coupled to a gate terminal of second NMOS transistor 304, a gate terminal of first PMOS transistor 303 is coupled to a gate terminal of second PMOS transistor 305, and the gate terminal of second PMOS transistor 305 is coupled to a drain terminal of second PMOS transistor 305.

In some embodiments, PMOS transistors 303 and 305 are configured to operate in strong inversion; that is, in each of transistors 303 and 305, the hole density in the channel is larger than the electron density in the bulk. Also, first PMOS transistor 303 is configured to operate in a linear region or triode mode such that its $V_{gs}$ is greater than its $V_{th}$ and its $V_{ds}$ is smaller than a difference between $V_{gs}$ and $V_{th}$. Meanwhile, first NMOS transistor 302, second NMOS transistor 304, and second PMOS transistor 305 are each configured to operate in a saturation region such that, for each of these transistors, its $V_{gs}$ is greater than its $V_{th}$, and its $V_{ds}$ is greater than or equal to a difference between $V_{gs}$ and $V_{th}$.

In the signal branch, first NMOS transistor 302 is configured to operate as a diode, and first PMOS transistor 303 is configured to operate as a variable resistor. The impedance presented by second PMOS transistor 303 is controllable by control signal $I_{CTRL}$.

In this case, the voltage drop ($V_{DIV}$) between the drain of first NMOS transistor 302 and the drain of first PMOS transistor 303 is given by:

$$V_{DIV} = V_{GS\_302} + R_M I_{SIG}$$

where $R_M$ is the effective resistance presented to $I_{SIG}$ by cell 301 and $V_{GS\_302}$ is the source-to-gate-voltage of first PMOS transistor 103. Again, using the same MOSFET device models for each of transistors 302-305 configured as described above, the value of $R_M$ may be calculated as follows:

$$R_M = \frac{1}{\sqrt{I_{CTRL} \cdot \mu_p C_{OX} S_p(W_p/L_p)} + \mu_p C_{OX} S_p(W_p/L_p) \cdot (V_{GS\_304} - V_{GS\_302})}$$

where $W_p/L_p = W_{303}/L_{303} = S_p(W_{305}/L_{305})$, $W_{303}$ being the gate width of first PMOS transistor 303, $L_{303}$ being the gate length of first PMOS transistor 303, $W_{305}$ being the gate width of second PMOS transistor 305, and $L_{305}$ being the gate length of second PMOS transistor 305; and where $C_{ox}$ is the oxide capacitance of transistors 302-305, $\mu_p$ is the hole mobility of first PMOS transistor 302, $V_{GS\_304}$ is the gate-to-source voltage of second NMOS transistor 304, and VGS 302 is the source-to-gate voltage of first NMOS transistor 302.

The values of $V_{GS\_302}$ and $V_{GS\_304}$ may be calculated depending upon whether the first and second NMOS transistors 302 and 304 are operating in strong or weak inversion. For example, when operating in strong inversion, the following expression may be used:

$$V_{GS\_304} - V_{GS\_302} = \sqrt{\frac{2}{\mu_n C_{OX}(W_n/L_n)}} \left( \sqrt{S_n I_{CTRL}} - \sqrt{I_{SIG}} \right)$$

where $W_n/L_n = W_{302}/L_{302} = S_n(W_{304}/W_{304})$, $W_{103}$ being the gate width of first NMOS transistor 302, $L_{103}$ being the gate length of first NMOS transistor 302, $W_{105}$ being the gate width of second NMOS transistor 304, and $L_{105}$ being the gate length of second NMOS transistor 304; and where $\mu_n$ is the electron mobility of first NMOS transistor 302.

Conversely, when first and second NMOS transistors 302 and 304 are operating in weak inversion, the following expression may be used:

$$V_{GS\_304} - V_{GS\_302} = \frac{nkT}{q} \exp\left( \frac{I_{CTRL}}{I_{SIG}} \cdot S_p \right)$$

where n is a slope factor and (kT/q) is the thermal voltage of first and second NMOS transistors 302 and 304.

Again, in other embodiments, other device models, and therefore other expressions, may be used. Nonetheless, by maintaining first PMOS transistor 303 in a linear region or triode mode and other transistors 302, 304 and 305 in a saturation region, first PMOS transistor 303 operates as a variable resistor, first NMOS transistor 302 operates as a diode, and the impedance in the signal path $I_{SIG}$ is controllable by control signal $I_{CTRL}$.

As previously noted, voltage divider cells such as cells 101 and 301 may be coupled together to form a voltage divider. The signal branches of each individual voltage divider cell 101 and/or 301 may be coupled in series with one another, with one or more voltage division taps placed along the signal path. Control branches may be left independent or also coupled in series.

Figure 4:
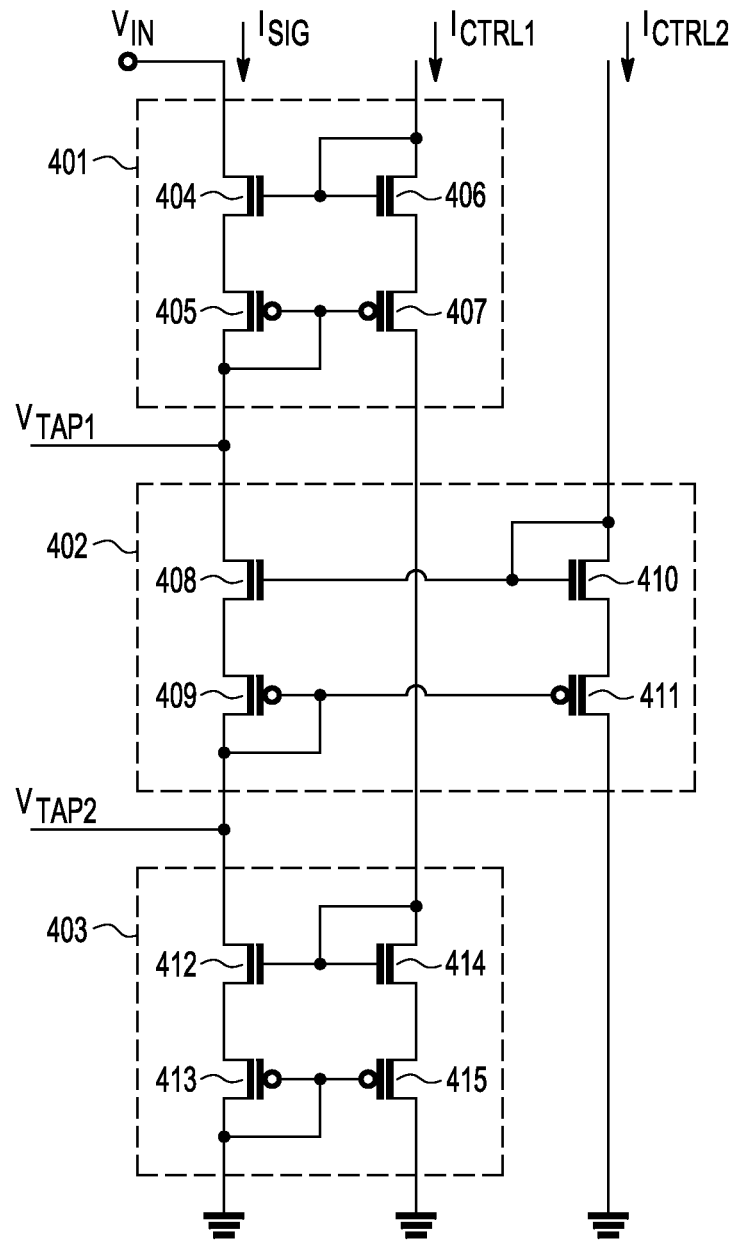
FIG. 4 is a circuit diagram of an example of a voltage divider with two control paths according to some embodiments.

FIG. 4 is a circuit diagram of an example of voltage divider 400 with two control paths, according to some embodiments. As illustrated, first voltage divider cell 401 includes transistors 404-407, second voltage divider cell 402 includes transistors 408-411, and third voltage divider cell 403 includes transistor 412-415. One or more nodes on the signal path may be tapped, for example, at $V_{TAP1}$ and/or $V_{TAP2}$ to effect voltage division operation(s).

In this example, each of cells 401-403 is similar to cell 101 shown in FIG. 1. Moreover, the signal branch receiving $I_{SIG}$ is the same for all cells 401-403. However, first and third cells 401 and 403 receive the same control signal $I_{CTRL1}$ via first control branch, and second cell 402 receives a separate control signal $I_{CTRL2}$ via a second control branch distinct from the first control branch. The use of a second control signal $I_{CTRL2}$ may help ensure that transistors 409-411 in cell 402, for example, are operating in their saturation region. Moreover, the impedance presented by second cell 402 may be controlled independently of the impedance presented by cells 401 and 403; although in some cases $I_{CTRL2}$ may be equal to $I_{CTRL1}$. Voltage taps (not shown) may be present at any node between cells 401-403 to facilitate a voltage division operation as desired.

Figure 5:
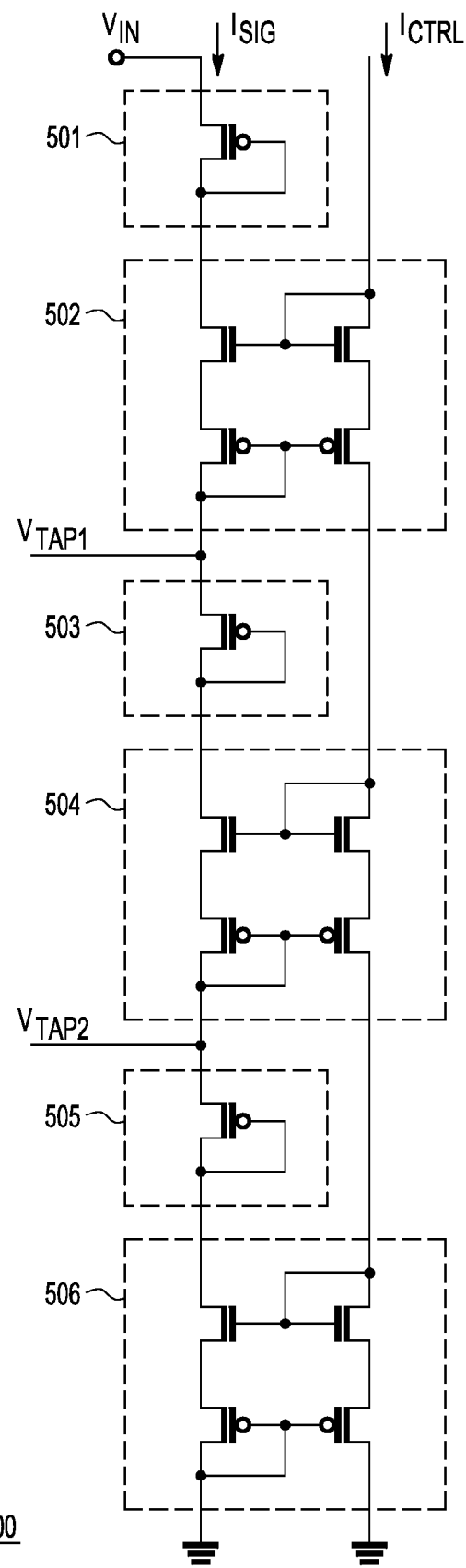
FIG. 5 is a circuit diagram of an example of a voltage divider with one control path according to some embodiments.

FIG. 5 is a circuit diagram of an example of voltage divider 500 with one control path according to some embodiments. Here, three voltage divider cells 502, 504, and 506, each similar to cell 101 shown in FIG. 1, are interspersed by PMOS transistors 501, 503, and 505. Again, one or more nodes on the signal path may be tapped, for example, at $V_{TAP1}$ and/or $V_{TAP2}$ to effect voltage division operation(s).

In this implementation, PMOS transistors 501, 503, and 505 are configured to behave as diodes and improve the voltage headroom between cells 502, 504, and 506. Consequently, cells 502, 504, and 506 are capable of sharing the same signal branch receiving $I_{SIG}$, as well as the same control branch receiving signal $I_{CTRL1}$. Again, voltage taps (not shown) may be present at any node between cells 502, 504, and/or 506.

Figure 6:
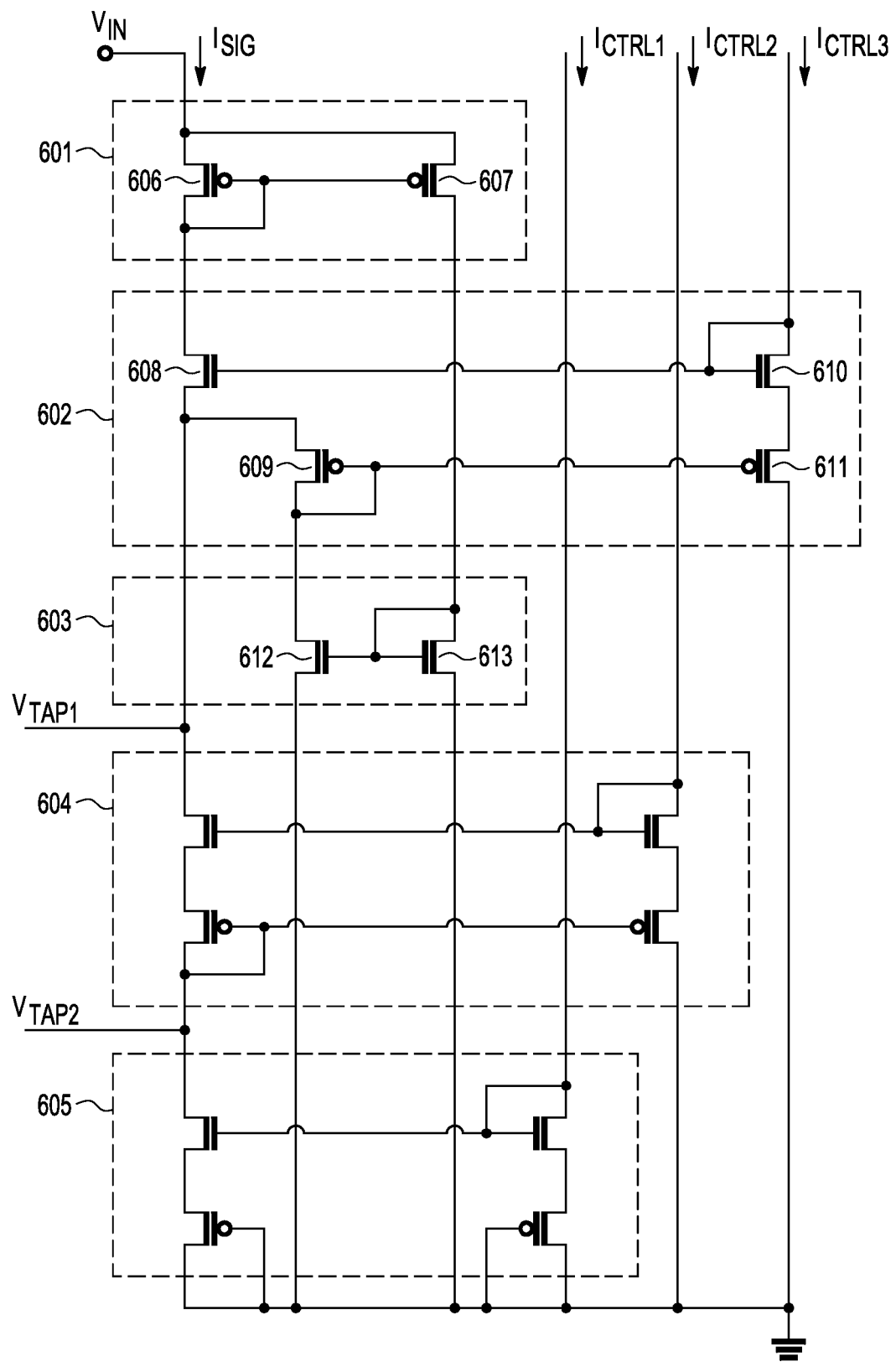
FIG. 6 is a circuit diagram of an example of a voltage divider with a modified voltage divider cell having increased voltage headroom according to some embodiments.

FIG. 6 is a circuit diagram of an example of voltage divider 600 with a modified voltage divider cell 602 having increased voltage headroom according to some embodiments. To better understand the modifications made in FIG. 6, attention is redirected to FIG. 1. In voltage division cell 101, the voltage potential at the drain of first NMOS transistor 102 ($V_{IN}$) is lower than the voltage potential at the drain of second NMOS transistor 104, because first NMOS transistor 102 operates in triode mode whereas second NMOS transistor 104 is diode-connected. Although the signal of interest is $V_{IN}$, the voltage at the drain of second NMOS transistor 104 may, in some cases, impose a minimum voltage headroom required by cell 101 to operate properly.

Hence, referring back to FIG. 6, PMOS transistors 606 and 607 of block 601 and NMOS transistors 612 and 613 of block 603 are introduced in addition to transistors 608-611 of cell 602. As such, $I_{SIG}$ is mirrored by transistors 607, 612, and 613, and used to bias transistor 609. The result is that NMOS and PMOS transistors at the top of the signal path are flipped; that is, relative to the drain voltage of PMOS transistor 610, $V_{IN}$ is now higher by one extra PMOS gate-to-source voltage, generally becoming the highest potential of the voltage division cell stack, and thus reducing or eliminating voltage headroom concerns. Cells 604 and 605 operate similarly as cell 101 in FIG. 1, each with its own control signal $I_{CTRL1}$ and signal $I_{CTRL2}$.

In many implementations, the systems and methods disclosed herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Figure 7:
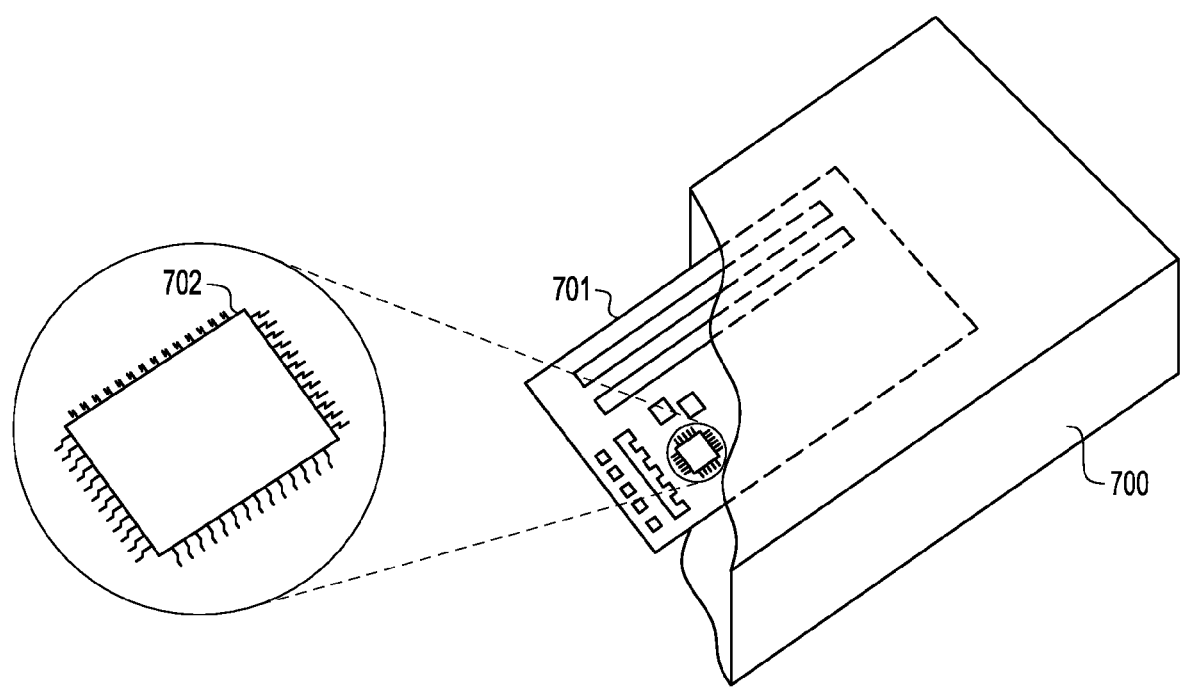
FIG. 7 is a diagram of an example of a Printed Circuit Board (PCB) of a device having one or more electronic chips, according to some embodiments.

Turning to FIG. 7, a block diagram of electronic device 700 is depicted. In some embodiments, electronic device 700 may be any of the aforementioned electronic devices, or any other electronic device. As illustrated, electronic device 700 includes one or more Printed Circuit Boards (PCBs) 701, and at least one of PCBs 701 includes one or more chips 702. In some implementations, one or more ICs within chip 702 may implement one or more voltage division cells such as those discussed above. For example, one or more circuits within an IC may operate with a supply voltage different from that of an available battery or power supply, and that supply voltage may be provided using one or more of the foregoing voltage division cells.

Examples of IC(s) that may be present within chip 702 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), a Graphics Processing Unit (GPU), or the like. Additionally or alternatively, IC(s) may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate RAM, an Erasable Programmable ROM (EPROM), an Electrically Erasable Programmable ROM (EEPROM), etc. Additionally or alternatively, IC(s) may include one or more mixed-signal or analog circuits, such as, for example, Analog-to-Digital Converter (ADCs), Digital-to-Analog Converter (DACs), Phased Locked Loop (PLLs), oscillators, filters, amplifiers, etc. Additionally or alternatively, IC(s) may include one or more Micro-ElectroMechanical Systems (MEMS), Nano-ElectroMechanical Systems (NEMS), or the like.

Accordingly, an IC within chip 702 may include a number of different portions, areas, or regions. These various portions may include one or more processing cores, cache memories, internal bus(es), timing units, controllers, analog sections, mechanical elements, etc. In various embodiments, these different portions, areas, or regions may each be in a different power domain, and therefore may each include one or more voltage dividers or the like.

Generally speaking, chip 702 may include an electronic component package configured to be mounted onto PCB 701 using any suitable packaging technology such as, for example, Ball Grid Array (BGA) packaging or the like. In some applications, PCB 701 may be mechanically mounted within or fastened onto electronic device 700. It should be noted that, in certain implementations, PCB 701 may take a variety of forms and/or may include a plurality of other elements or components in addition to chip 702. It should also be noted that, in some embodiments, PCB 701 may not be used.

Although the example of FIG. 7 shows electronic chip 702 in monolithic form, it should be understood that, in alternative embodiments, the systems and methods described herein may be implemented with discrete components. For example, in some cases, one or more logic gates, multiplexers, latches, flip-flops, etc. may be located outside of chip 702, and one or more of these external components may be operably coupled to an IC fabricated within chip 702. In other cases, chip 702 may assume any other suitable form.

As discussed above, in an illustrative, non-limiting embodiment, a voltage divider may comprise a voltage division cell. The voltage division cell may include a first N-type Metal-Oxide-Semiconductor (NMOS) transistor; a first P-type (PMOS) transistor coupled in series with the first NMOS transistor, a source terminal of the first NMOS transistor connected to a source terminal of the first PMOS transistor, and a gate terminal of the first PMOS transistor connected to a drain terminal of the first PMOS transistor; a second NMOS transistor having a gate terminal connected to a gate terminal of the first NMOS transistor; and a second PMOS transistor coupled in series with the second NMOS transistor, a source terminal of the second NMOS transistor connected to a source terminal of the second PMOS transistor, a drain terminal of the second NMOS transistor connected to the gate terminal of the second NMOS transistor, and a gate terminal of the second PMOS transistor connected to the gate terminal of the first PMOS transistor.

In some implementations, the drain terminal of the second NMOS transistor may be configured to receive a control current adapted to control a voltage drop between the drain terminal of the first NMOS transistor and the drain terminal of the first PMOS transistor. The first NMOS transistor may be configured to operate in a linear region during operation of the cell, and it may be dynamically biased by the control current. Also, the first PMOS transistor, the second NMOS transistor, and the second PMOS transistor may each be configured to operate in a saturation region during operation of the cell.

In another illustrative, non-limiting embodiment, a voltage divider may comprise a voltage division cell. The voltage division cell may include a voltage division cell including a first N-type Metal-Oxide-Semiconductor (NMOS) transistor; a first P-type (PMOS) transistor coupled in series with the first NMOS transistor, a source terminal of the first NMOS transistor connected to a source terminal of the first PMOS transistor, and a drain terminal of the first NMOS transistor connected to a gate terminal of the first NMOS transistor; a second NMOS transistor, the gate terminal of the first NMOS transistor connected to a gate terminal of the second NMOS transistor; and a second PMOS transistor coupled in series with the second NMOS transistor, a source terminal of the second NMOS transistor connected to a source terminal of the second PMOS transistor, a gate terminal of the first PMOS transistor connected to a gate terminal of the second PMOS transistor, and the gate terminal of the second PMOS transistor connected to a drain terminal of the second PMOS transistor.

In some implementations, the drain terminal of the second NMOS transistor may be configured to receive a control current adapted to control a voltage drop between the drain terminal of the first NMOS transistor and the drain terminal of the first PMOS transistor. The first PMOS transistor may be configured to operate in a linear region during operation of the cell, and it may be dynamically biased by the control current. Also, the first NMOS transistor, the second NMOS transistor, and the second PMOS transistor may each be configured to operate in a saturation region during operation of the cell.

In yet another illustrative, non-limiting embodiment, an electronic circuit may comprise a voltage divider including two or more voltage division cells, each voltage division cell having a plurality of Metal-Oxide-Semiconductor (MOS) transistors, a least one of the plurality of MOS transistors connected to a signal path and at least another one of the plurality of MOS transistors connected to a control path, the voltage division cell configured to provide a voltage drop across the signal path based upon a control signal applied to the control path.

The electronic circuit may also include a second voltage division cell the signal path and a second control path, wherein the second voltage division cell includes a plurality of CMOS transistors, and wherein the second voltage division cell is configured to provide a second voltage drop in the signal path based upon a second signal applied to the second control path.

In some cases, the second control path may be the same as the control path, the second control signal may be the same as the control signal, and the second voltage drop may be the same as the voltage drop. Alternatively, the second control path may be different from the control path, the second control signal may be different from the control signal, and wherein the second voltage drop may be different from the voltage drop.

Furthermore, in some cases, a diode may be coupled between the two or more voltage division cells on the signal path. Additionally or alternatively, a current mirror may be coupled between the two or more voltage division cells on the signal path.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A voltage divider, comprising:
   a voltage division cell including:
      a first N-type Metal-Oxide-Semiconductor (NMOS) transistor;
      a first P-type (PMOS) transistor coupled in series with the first NMOS transistor, a source terminal of the first NMOS transistor directly connected to a source terminal of the first PMOS transistor, and a gate terminal of the first PMOS transistor connected to a drain terminal of the first PMOS transistor;
      a second NMOS transistor having a gate terminal directly connected to a gate terminal of the first NMOS transistor; and
      a second PMOS transistor coupled in series with the second NMOS transistor, a source terminal of the second NMOS transistor directly connected to a source terminal of the second PMOS transistor, a drain terminal of the second NMOS transistor connected to the gate terminal of the second NMOS transistor, and a gate terminal of the second PMOS transistor connected to the gate terminal of the first PMOS transistor.

2. The voltage divider of claim 1, wherein the drain terminal of the second NMOS transistor is configured to receive a control current adapted to control a voltage drop between the drain terminal of the first NMOS transistor and the drain terminal of the first PMOS transistor.

3. The voltage divider of claim 2, wherein the first NMOS transistor is configured to operate in a linear region during operation of the cell.

4. The voltage divider of claim 3, wherein the first NMOS transistor is configured to be dynamically biased by the control current.

5. The voltage divider of claim 3, wherein the first PMOS transistor, the second NMOS transistor, and the second PMOS transistor are each configured to operate in a saturation region during operation of the cell.

6. An electronic circuit, comprising:
   a voltage divider including two or more voltage division cells;
      a first voltage division cell having a plurality of Metal-Oxide-Semiconductor (MOS) transistors, a least one of the plurality of MOS transistors connected to a signal path and at least another one of the plurality of MOS transistors connected to a control path, the first voltage division cell configured to provide a voltage drop across the signal path based upon a control signal applied to the control path; and a second voltage division cell and a second control path, wherein the second voltage division cell includes a second plurality of MOS transistors, and wherein the second voltage division cell is configured to provide a second voltage drop in the signal path based upon a second signal applied to the second control path, wherein the second control path is different from the control path, the second control signal is different from the control signal, and the second voltage drop is different from the voltage drop.

7. The electronic circuit of claim 6, wherein the plurality of MOS transistors includes:
a first N-type Metal-Oxide-Semiconductor (NMOS) transistor;
a first P-type (PMOS) transistor coupled in series with the first NMOS transistor, a source terminal of the first NMOS transistor connected to a source terminal of the first PMOS transistor, and a gate terminal of the first PMOS transistor connected to a drain terminal of the first PMOS transistor;
a second NMOS transistor having a gate terminal connected to a gate terminal of the first NMOS transistor; and
a second PMOS transistor coupled in series with the second NMOS transistor, a source terminal of the second NMOS transistor connected to a source terminal of the second PMOS transistor, a drain terminal of the second NMOS transistor connected to the gate terminal of the second NMOS transistor, and a gate terminal of the second PMOS transistor connected to the gate terminal of the first PMOS transistor.

8. The electronic circuit of claim 7, wherein the drain terminal of the second NMOS transistor is configured to receive the control signal, and wherein a resistance presented by the first PMOS transistor is inversely proportional to the control signal.

9. The electronic circuit of claim 8, wherein the drain terminal of the second NMOS transistor is configured to receive the control signal.

10. The electronic circuit of claim 6, further comprising a diode coupled between the two or more voltage division cells on the signal path.

11. The electronic circuit of claim 6, further comprising a current mirror coupled between the two or more voltage division cells on the signal path.

* * * * *